United States Patent
Zhao

(10) Patent No.: US 10,037,943 B2
(45) Date of Patent: Jul. 31, 2018

(54) METAL GATE TRANSISTOR AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Jie Zhao, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/392,215

(22) Filed: Dec. 28, 2016

(65) Prior Publication Data

US 2017/0186692 A1      Jun. 29, 2017

(30) Foreign Application Priority Data

Dec. 28, 2015 (CN) .......................... 2015 1 1001045

(51) Int. Cl.
| | |
|---|---|
| H01L 21/8238 | (2006.01) |
| H01L 23/535 | (2006.01) |
| H01L 21/02 | (2006.01) |
| H01L 21/768 | (2006.01) |

(Continued)

(52) U.S. Cl.
CPC ........ *H01L 23/535* (2013.01); *H01L 21/0214* (2013.01); *H01L 21/0217* (2013.01); *H01L 21/0228* (2013.01); *H01L 21/02271* (2013.01); *H01L 21/76897* (2013.01); *H01L 29/495* (2013.01); *H01L 29/4966* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 9,178,036 B1 | 11/2015 | Xie et al. | |
| 9,276,085 B2 * | 3/2016 | Yin | ..................... H01L 29/6656 |
| 9,570,611 B2 * | 2/2017 | Li | ..................... H01L 29/7848 |

(Continued)

*Primary Examiner* — Telly Green
(74) *Attorney, Agent, or Firm* — Anova Law Group, PLLC

(57) ABSTRACT

A method for fabricating a metal gate transistor includes forming a dummy gate structure surrounded by a first dielectric layer on a semiconductor substrate and a source/drain region in the semiconductor substrate on each side of the dummy gate structure. The top surface of the dummy gate structure is leveled with the top surface of the first dielectric layer. The method then includes forming an etch stop sidewall in the first dielectric layer on each side of the dummy gate structure, forming a first trench by removing the dummy gate structure, and forming a metal gate structure to partially fill the first trench. The top portion of the first trench becomes a second trench. Further, the method also includes forming an etch stop layer by filling the second trench, and then forming a contact plug in the first dielectric layer to electrically connect to each source/drain region.

20 Claims, 8 Drawing Sheets

(51) Int. Cl.
    *H01L 29/49*       (2006.01)
    *H01L 29/66*       (2006.01)

(52) U.S. Cl.
    CPC .... *H01L 29/6653* (2013.01); *H01L 29/66545* (2013.01); *H01L 29/66795* (2013.01)

(56) References Cited

U.S. PATENT DOCUMENTS

| | | | |
|---|---|---|---|
| 2008/0150131 A1* | 6/2008 | Ruan | H01L 21/02074 257/734 |
| 2012/0119307 A1 | 5/2012 | Li | |
| 2012/0175711 A1 | 7/2012 | Ramachandran | |
| 2013/0248950 A1 | 9/2013 | Kang et al. | |
| 2014/0231923 A1* | 8/2014 | Yin | H01L 29/66545 257/369 |
| 2015/0021683 A1 | 1/2015 | Xie et al. | |
| 2015/0093871 A1* | 4/2015 | Li | H01L 29/66545 438/287 |
| 2015/0115374 A1* | 4/2015 | Yin | H01L 29/6656 257/408 |
| 2015/0145073 A1 | 5/2015 | Lee et al. | |
| 2016/0225903 A1* | 8/2016 | Li | H01L 29/7848 |

* cited by examiner

METAL GATE TRANSISTOR AND FABRICATION METHOD THEREOF

CROSS-REFERENCES TO RELATED APPLICATIONS

This application claims the priority of Chinese Patent Application No. CN201511001045.1, filed on Dec. 28, 2015, the entire content of which is incorporated herein by reference.

FIELD OF THE DISCLOSURE

The present disclosure generally relates to the field of semiconductor fabrication technology and, more particularly, relates to a metal gate transistor and fabrication methods thereof.

BACKGROUND

For semiconductor manufacturing, especially for very large scale integrated (VLSI) circuits, the main device component is metal-oxide-semiconductor field-effect transistor (MOSFET). Since the invention of MOSFET, the geometric size of MOSFET has been continuously reduced following the Moore's law. However, the physical limits of devices may lead to increasing challenges in continuously scaling down the devices. Specifically, in the field of MOSFET manufacturing, the challenging aspect is a current leaking problem due to decreases in the thicknesses of the polycrystalline Si layer and the $SiO_2$ dielectric layer in the traditional MOS technology as the devices are scaled down.

Aimed to solve the above problems, the current technology uses high-k (dielectric constant or permittivity) dielectric material to replace the traditional $SiO_2$ dielectric material. In the meantime, the current technology also uses metal gate to match with the high-k dielectric material.

According to existing methods, during the formation of contact plugs in source/drain regions of a metal gate transistor, a number of factors, such as the size of the via and the overlay (OVL) offset in aligning the photomask and the substrate, may cause a short circuit between the metal gate and the formed contact plug in the source/drain region, which may reduce device yield. On the other hand, the size of the via and the OVL offset in aligning the photomask and the substrate may be reduced in order to improve device yield, but process cost may also be increased.

The disclosed fabrication method and metal gate transistor are directed to solve one or more problems set forth above and other problems in the art.

BRIEF SUMMARY OF THE DISCLOSURE

One aspect of the present disclosure includes a method for fabricating a metal gate transistor. The method includes forming a dummy gate structure and a first dielectric layer on a semiconductor substrate and a source/drain region in the semiconductor substrate on each side of the dummy gate structure. The dummy gate structure is surrounded by the first dielectric layer and the top surface of the dummy gate structure is leveled with the top surface of the first dielectric layer. The method then includes forming an etch stop sidewall in the first dielectric layer on each side of the dummy gate structure. The top surface of the etch stop sidewall is leveled with the top surfaces of the first dielectric layer and the dummy gate structure. The method further includes forming a first trench by removing the dummy gate structure, and forming a metal gate structure to partially fill the first trench. The top portion of the first trench becomes a second trench. Further, the method also includes forming an etch stop layer by filling the second trench, and forming a contact plug in the first dielectric layer to electrically connect to each source/drain region.

Another aspect of the present disclosure provides another method for fabricating a metal gate transistor. The method includes forming a high-k dielectric layer on a semiconductor substrate and a dummy gate electrode on the high-k dielectric layer. The method also includes forming a source/drain region in the semiconductor substrate on each side of the high-k dielectric layer and a first dielectric layer on the semiconductor substrate to surround the high-k dielectric layer and the dummy gate electrode. The top surface of the dummy gate electrode is leveled with the top surface of the first dielectric layer. Further, the method includes forming an etch stop sidewall in the first dielectric layer on each side of the dummy gate electrode. The top surface of the etch stop sidewall is leveled with the top surfaces of the first dielectric layer and the dummy gate electrode. Moreover, the method includes forming a first trench by removing the dummy gate electrode, and forming a metal gate structure to partially fill the first trench. The high-k dielectric layer is the dielectric layer of the formed metal gate structure and a top portion of the first trench becomes a second trench. Finally, the method also includes forming an etch stop layer to fill the second trench, and forming a contact plug in the first dielectric layer to electrically connect to each source/drain region.

Another aspect of the present disclosure provides a metal gate transistor. The metal gate transistor includes a semiconductor substrate, a metal gate structure including a high-k dielectric layer formed on the semiconductor substrate, a work function layer formed on the high-k dielectric layer, and a metal gate formed on the work function layer. The metal gate transistor also includes a first dielectric layer surrounding the metal gate structure, a source/drain region formed in the semiconductor substrate on each side of the metal gate structure, an etch stop layer formed on the metal gate structure with a top surface leveled with the top surface of the first dielectric layer, and an etch stop sidewall formed on each side of the metal gate structure. The top surface of the etch stop sidewall is leveled with the top surface of the first dielectric layer. Finally, the metal gate transistor includes a contact plug formed in the first dielectric layer to electrically connect to each source/drain region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described in the above background section, when using existing methods to fabricate contact plugs in source/drain regions of metal gate transistors, the product yield may be low. Further, according to existing methods, the accuracy in aligning mask plate with substrate and the dimension precision in the photolithography process may need to be improved in order to raise the product yield. However, improving the alignment accuracy may also result in increased process cost. In view of the above problems, the present disclosure provides an improved method to fabricated contact plugs in source/drain regions of metal gate transistors.

Figure 14:
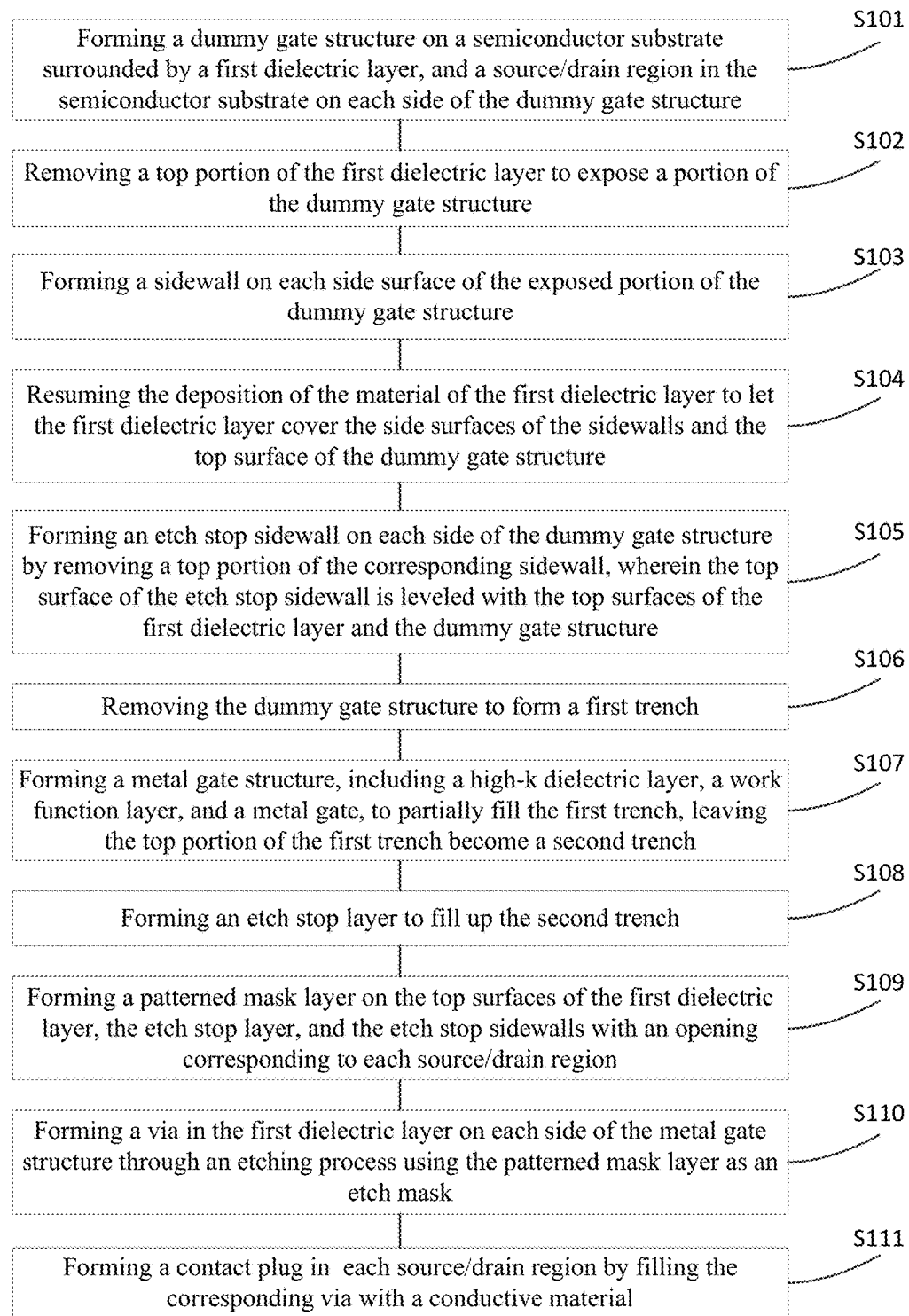
FIG. 14 illustrates a flowchart of the exemplary fabrication process consistent with disclosed embodiments.

FIG. 14 shows a flowchart of the exemplary process for fabricating a contact plug in each source/drain region of a metal gate transistor consistent with disclosed embodiments. FIGS. 1-9 show schematic views of semiconductor structures corresponding to certain stages of the exemplary fabrication method consistent with various disclosed embodiments.

Figure 1:
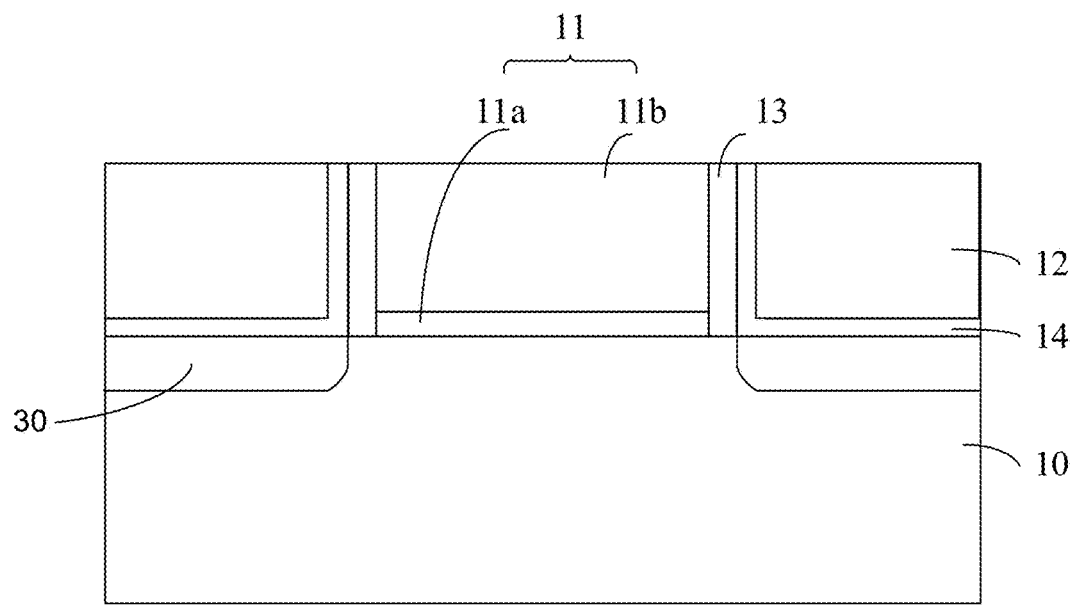
FIGS. 1-9 illustrate schematic views of semiconductor structures corresponding to certain stages of an exemplary fabrication method for a contact plug in a source/drain region of a metal gate transistor consistent with various disclosed embodiments.

Referring to FIG. 14, at the beginning of the fabrication process, a dummy gate structure and a first dielectric layer surrounding the dummy gate structure may be formed on a semiconductor substrate and a source/drain region may be formed in the semiconductor substrate on each side of the dummy gate structure (S101). FIG. 1 shows a schematic cross-section view of the semiconductor structure.

Referring to FIG. 1, a semiconductor substrate 10 is provided. A dummy gate structure 11 and a first dielectric layer 12 surrounding the dummy gate structure 11 may be formed on the surface of the semiconductor substrate 10. The top surface of the first dielectric layer 12 may be leveled with the top surface of the dummy gate structure 11.

The semiconductor substrate 10 may be made of Si, Ge, silicon on insulator (SIO), etc. The dummy gate structure 11 may include a dummy gate insulating layer 11a formed on the semiconductor substrate 10 and a dummy gate electrode 11b formed on the top of the dummy gate insulating layer 11a. In one embodiment, the dummy gate insulating layer 11a may be made of $SiO_2$ while the dummy gate electrode 11b may be made of doped or un-doped polycrystalline silicon. The dummy gate insulating layer 11a and the dummy gate electrode 11b may be fabricated by a same process for forming gate insulating layers and gate electrodes of transistors in other regions. That is, the dummy gate insulating layer 11a and the dummy gate electrode 11b may be simultaneously formed with gate insulating layers and gate electrodes of transistors in other regions.

An offset spacer 13 may be formed on each side of the dummy gate structure 11. The offset spacer 13 may be made of SiN. The offset spacer 13 may be used to increase the length of the channel region in order to avoid short channel effect. Further, source/drain regions 30 may also be formed in the semiconductor substrate 10 on the two sides of the dummy gate structure 11. In addition, a contact-via etch stop layer 14 may be formed between the first dielectric layer 12 and the dummy gate structure 11 and also between the first dielectric layer 12 and the semiconductor substrate 10. The contact-via etch stop layers 14 may be made of SiN. The contact-via etch stop layers 14 may be used to determine the etch termination point for forming contact vias in the source/drain regions 30 during a subsequent dry etching process.

Figure 2:
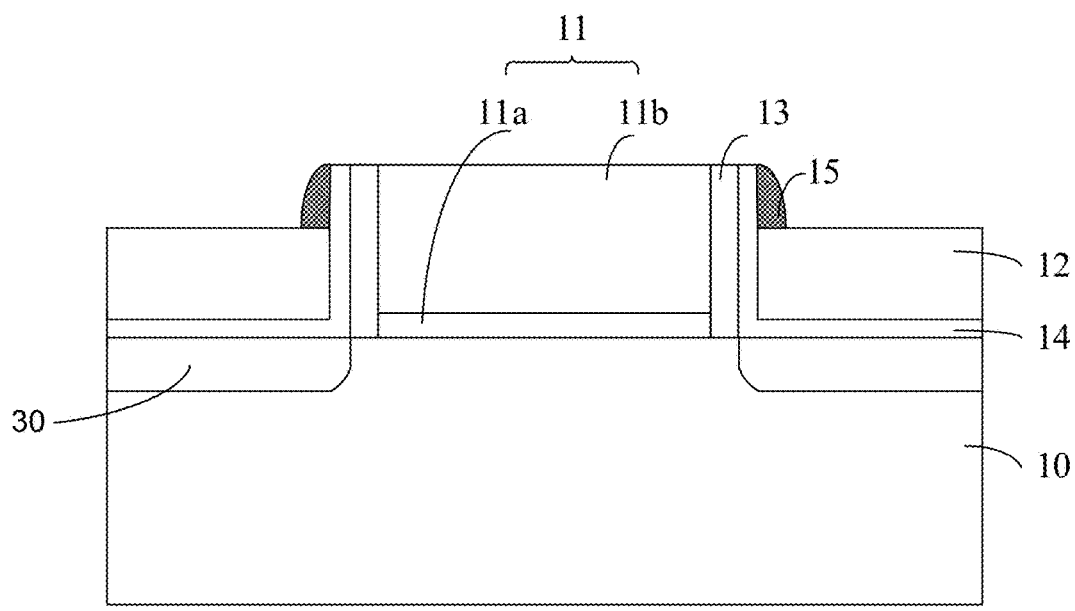

Returning to FIG. 14, a top portion of the first dielectric layer may be removed to expose a portion of the dummy gate structure (S102). FIG. 2 shows the corresponding semiconductor structure.

Referring to FIG. 2, a top portion of the first dielectric layer 12 is removed. With the top portion of the first dielectric layer 12 is removed, a portion of the dummy gate structure 11 and a portion of each offset spacer 13 formed on a side surface of the dummy gate structure 11 may exceed the level of the top surface of the remaining portion of the first dielectric layer 12.

The portion of the first dielectric layer 12 may be removed by a photolithography process followed by a dry etching process. In one embodiment, because a contact-via etch stop layer 14 is formed between the first dielectric layer 12 and the dummy gate structure 11, after removing the portion of the first dielectric layer 12, a portion of each contact-via etch stop layer 14 formed on the corresponding offset spacer 13 on a sidewall surface of the dummy gate structure 11 may be exposed.

Further, returning to FIG. 14, a sidewall may be formed on each side surface of the exposed portion of the dummy gate structure (S103). FIG. 2 shows a schematic cross-section view of the semiconductor structure with a sidewall 15 formed on each side of the exposed dummy gate structure 11.

Referring to FIG. 2, after removing the portion of the first dielectric layer 12, a sidewall material layer may be formed on the top surface of the remaining portion of the first dielectric layer 12, the top surface of the dummy gate structure 11, and the side surfaces of the exposed portion of the dummy gate structure 11. An etch-back process may then be performed on the sidewall material layer to form two sidewalls 15 to surround the exposed top portion of the dummy gate structure 11.

The sidewall material layer may be made of at least one of $SiN_x$, SiON, SiOBN, and SiOCN. In one embodiment, the sidewall material layer may be made of a material with a relatively low etching rate. Specifically, the etching rate on the sidewall material layer may be lower than the etching rate on the first dielectric layer 12. The sidewall material layer may be made of an atomic layer deposition (ALD) process or a chemical vapor deposition (CVD) process.

Returning to FIG. 14, further, the material of the first dielectric layer may be deposited again to cover the top surface of the remaining portion of the previous first dielectric layer, the side surfaces of the sidewalls, and the top surface of the dummy gate structure (S104).

Specifically, deposition of the material of the first dielectric layer 12 may be resumed to let the first dielectric layer 12 cover the top surface of the remaining portion of the previous first dielectric layer 12, the side surface of the sidewalls 15, and the top surface of the dummy gate structure 11.

In one embodiment, the first dielectric layer 12 is made of $SiO_2$. The first dielectric layer 12 may be formed by a CVD method using silane or tetraethyl orthosilicate (TEOS). The dielectric material of the first dielectric layer 12 is further deposited onto the top surface of the remaining first dielectric layer 12 until the top surface of the formed first dielectric layer 12 exceeds the top surface of the dummy gate structure 11.

Figure 3:
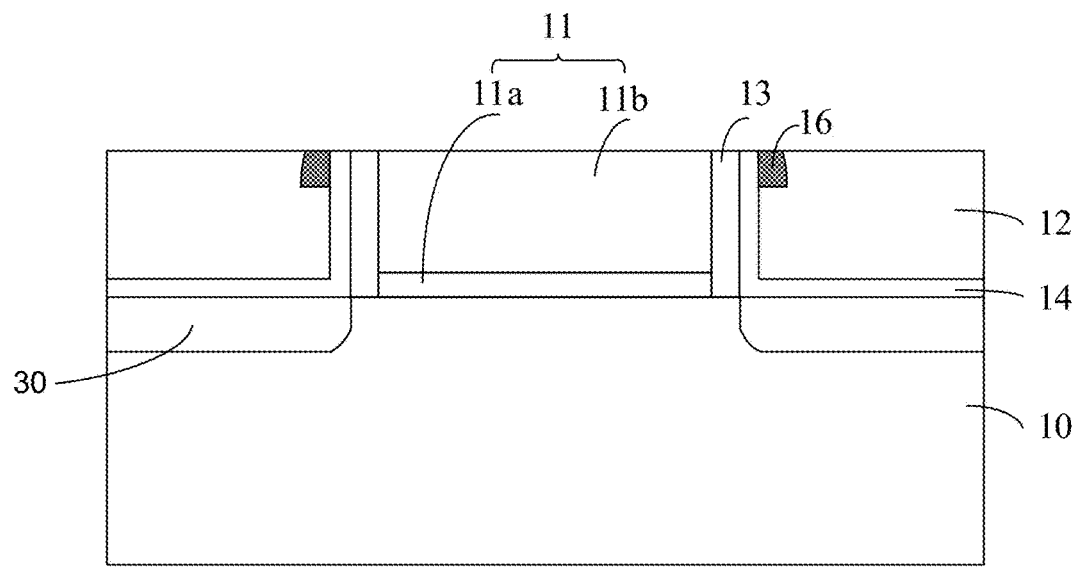

Further, returning to FIG. 14, a portion of each sidewall may be removed through a planarization process to form an etch stop sidewall with a top surface leveled with the top surfaces of the first dielectric layer and the dummy gate structure (S105). FIG. 3 shows a cross-section view of the corresponding semiconductor structure.

Referring to FIG. 3, a planarization process may be performed on the first dielectric layer 12, the sidewalls 15, and the dummy gate structure 11. During the planarization process, a portion of each sidewall 15 (referring to FIG. 2) may be removed to form an etch stop sidewall 16. In the meantime, a portion of the dummy gate structure 11 as well as a portion of the first dielectric layer 12 may also be removed. After the planarization process, the top surface of the etch stop sidewalls 16 may be leveled with the top surface of the dummy gate structure 11 and the top surface of the first dielectric layer 12.

In one embodiment, a planarization process is performed on the first dielectric layer 12, the sidewalls 15, and the dummy gate structure 11 to remove the top sharp tips of the sidewalls 15 and ensure a certain width for the top surface of each sidewall 15. The planarization process may be a chemical mechanical polishing (CMP) process.

Figure 4:
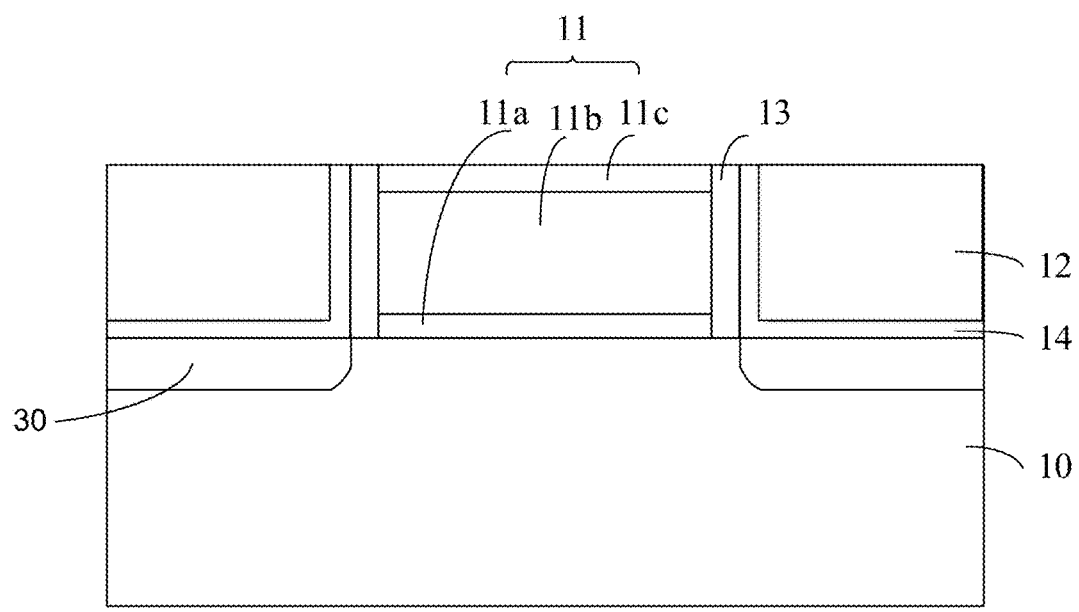

In certain other embodiments, as shown in FIG. 4, the dummy gate structure 11 may also include, from bottom to top, a dummy gate insulating layer 11a, a dummy gate electrode 11b, and a dummy gate structure hard mask layer 11c. The dummy gate insulating layer 11a and the dummy gate electrode 11b may be formed by a dry etching process performed on a dummy gate insulating material layer (not shown) and a dummy gate electrode material layer using the dummy gate structure hard mask layer 11c as an etch mask. The dummy gate structure hard mask layer 11c may be made of one of $SiN_x$, SiON, etc.

Figure 5:
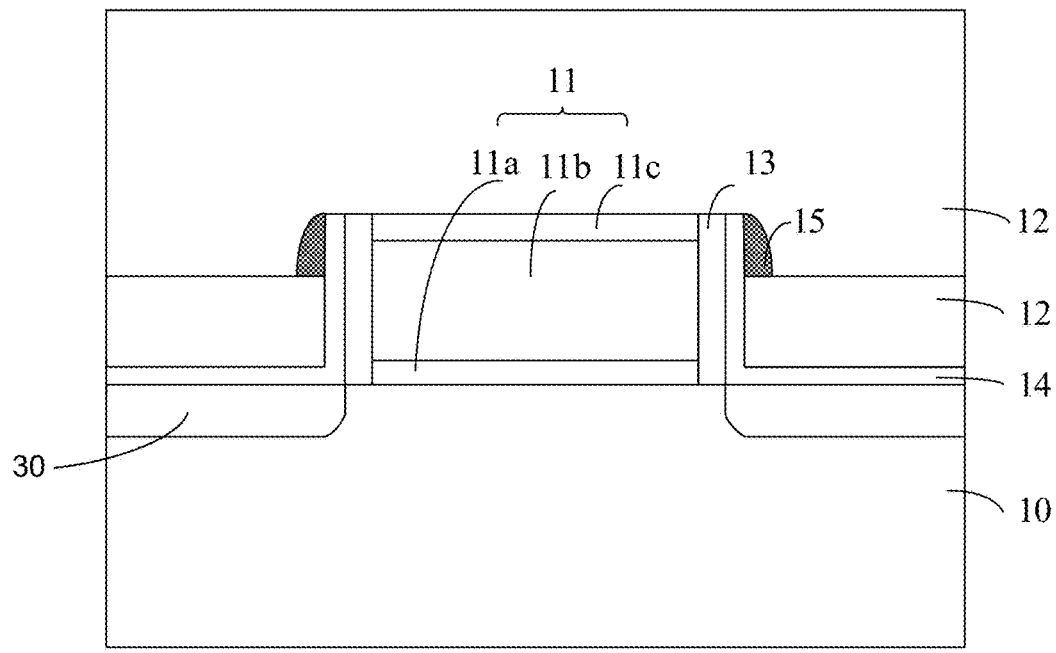

Keeping the dummy gate structure hard mask layer 11c may have the following advantages: as shown in FIG. 5, when performing a CMP process on the first dielectric layer 12 and the sidewalls 15, the dummy gate structure hard mask layer 11c may serve as a polish stop layer to define the termination point for the polishing process. Therefore, the termination point may be easily controlled and, thus, consumption of the dummy gate electrode 11b may be greatly avoided.

Figure 6:
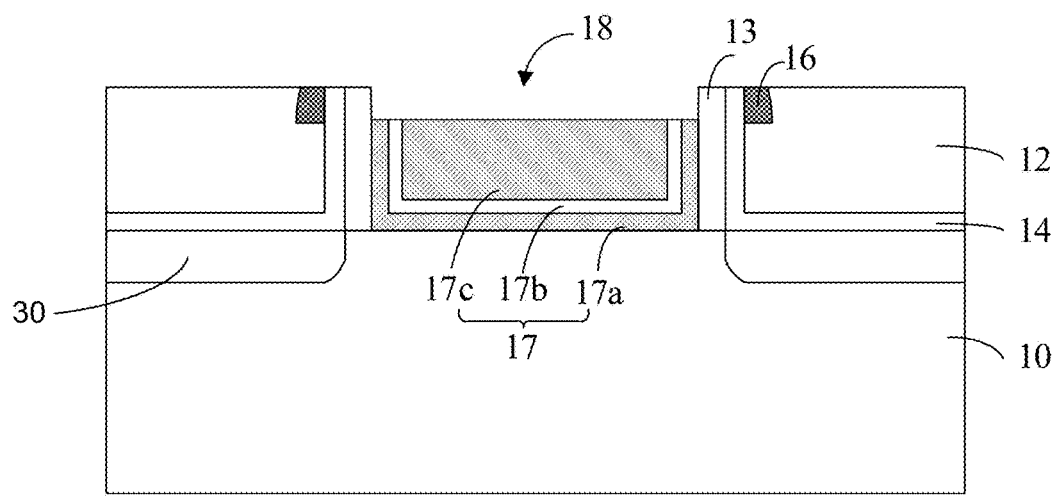

Further, returning to FIG. 14, the dummy gate structure may be removed to form a first trench (S106). FIG. 6 shows a schematic cross-section view of the corresponding semiconductor structure.

Referring to FIG. 6, the dummy gate structure 11 (referring to FIG. 3) is removed to form a first trench (not labeled). The first trench may expose a portion of the surface of the semiconductor substrate 10.

Returning to FIG. 13, further, a high-k dielectric layer, a work function layer, and a metal gate may be sequentially deposited to partially fill the first trench, leaving the top portion of the first trench become a second trench (S107).

Specifically, a high-k dielectric layer 17a, a work function layer 17b, and a metal gate 17c may be sequentially formed to fill the first trench. Further, a top portion of the high-k dielectric layer 17a, the work function layer 17b, and the metal gate 17c may then be removed to form a second trench 18. That is, the second trench 18 may be a top portion of the first trench formed before filling the high-k dielectric layer 17a, the work function layer 17b, and the metal gate 17c.

Therefore, the bottom surface of the second trench 18 may be below the top surfaces of the first dielectric layer 12, the etch stop sidewalls 16, the contact-via etch stop layers 14, and the offset spacers 13. In addition, the portion of the materials formed outside of the first trench during the formation of the high-k dielectric layer 17a, the work function layer 17b, and the metal gate 17c may also be removed.

The high-k dielectric layer 17a, the work function layer 17b, and the metal gate 17c together may form a metal gate structure 17. The high-k dielectric layer 17a may be made of at least one of $La_2O_3$, $BaZrO_3$, HfZrO, HfZrON, HfLaO, HfSiO, HfSiON, LaSiO, AlSiO, HfTaO, HfTiO, BaO, TiO, $Ti_2O_3$, $TiO_2$, SrO, $Al_2O_3$, $Si_3N_4$, etc. The work function layer 17b may be made of one or more of Ti, Al, $Ti_xAl_{1-x}$, TiC, TiAlC, etc. The metal gate 17c may be made of W.

Each of the high-k dielectric layer 17a, the work function layer 17b, and the metal gate 17c may be formed by a physical vapor deposition (PVD) process or a CVD process. The portion of the materials of the above layers formed outside of the first trench may be removed by a CMP process.

In one embodiment, after the deposition of the materials for the above layers and the subsequent removal of the portion of the materials deposited outside of the first trench, a top portion of the high-k dielectric layer 17a, the work function layer 17b, and the metal gate 17c formed in the first trench may be removed by a dry etching process or a wet etching process to form the second trench 18.

Specifically, when a dry etching process is performed, the etching gas may contain $SF_6$ together with one or more of $CF_4$, $CHF_3$, $C_3F_8$, etc., or contain $Cl_2$ together with one or more of $CF_4$, $CHF_3$, $C_3F_8$, etc. When the portion of the high-k dielectric layer 17a is removed by wet etching, the etching solution may include HF or any other appropriate acid. When the portion of the work function layer 17b and the portion of the metal gate 17c are removed by wet etching, the etching solution may be a mixture of $NH_4OH$, $H_2O_2$, and water (for example, a volume ratio of 1:1:5 for a 25% wt. $NH_4OH$ solution, $H_2O_2$, and $H_2O$), or a mixture of HCl, $H_2O_2$, and water (for example, a volume ratio of 1:1:6 for pure HCl acid, $H_2O_2$, and $H_2O$).

Figure 7:
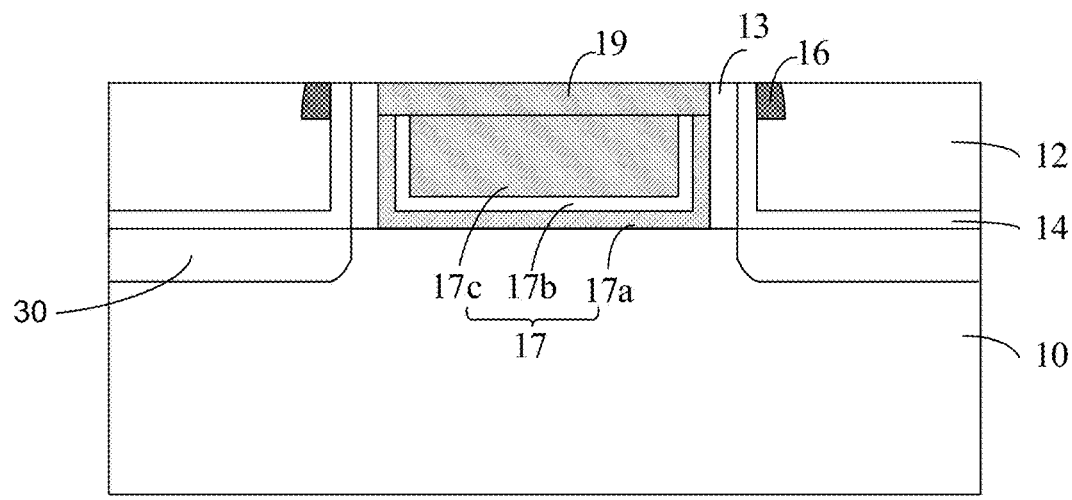

Further, returning to FIG. 14, an etch stop layer may be formed to fill up the second trench (S108). FIG. 7 shows a schematic cross-section view of the corresponding semiconductor structure.

Referring to FIG. 7, an etch stop layer 19 may be formed to fill up the second trench 18. The top surface of the etch stop layer 19 may be leveled with the top surface of the first dielectric layer 12 and the top surface of the etch stop sidewalls 16.

The material of the etch stop layer 19 may be different from the material of the first dielectric layer 12. In one embodiment, the etch stop layer 19 is made of a material with a relatively low etching rate. That is, the etching rate on the etch stop layer 19 may be lower than the etching rate on the first dielectric layer 12. Moreover, the etch stop layer 19 may be made of a same material as that used to form the etch stop sidewalls 16. That is, both the etch stop layer 19 and the etch stop sidewalls 16 may be made of a same insulating material.

In one embodiment, the etch stop layer 19 may be made of one or more of $SiN_x$, SiON, SiOBN, SiOCN, etc. The etch stop layer 19 may be formed by an ALD process or a CVD process. The material formed outside of the second trench 18 during the formation of the etch stop layer 19 may be removed by a CMP process.

Figure 8:
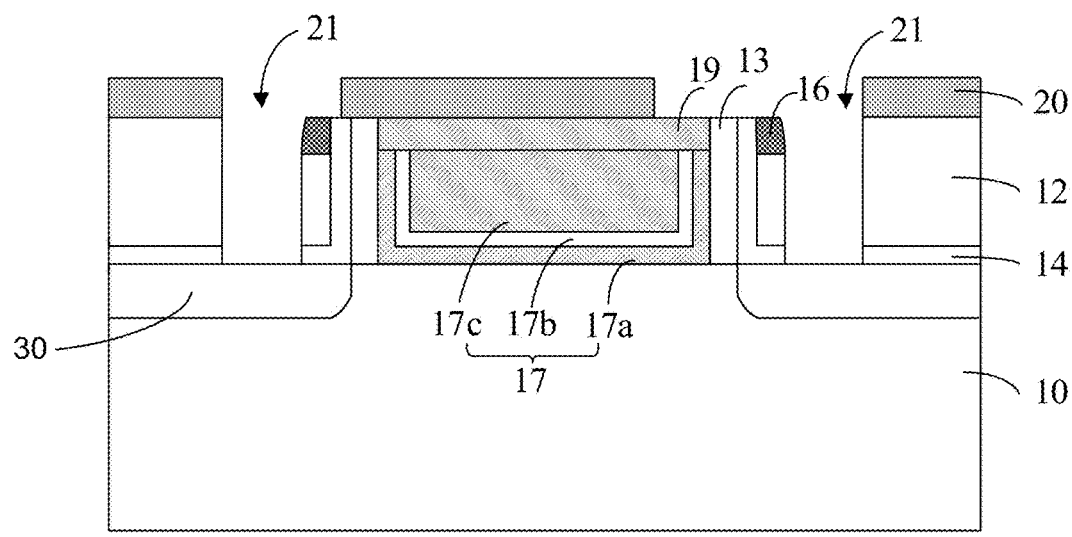

Further, returning to FIG. 14, a patterned mask layer may be formed on the top surfaces of the first dielectric layer, the etch stop layer, and the etch stop sidewalls (S109). FIG. 8 shows a schematic cross-section view of the corresponding semiconductor structure with a patterned mask layer 20 formed on the first dielectric layer, the etch stop layer, and the etch stop sidewalls.

Referring to FIG. 8, a patterned mask layer 20 may be formed on the top surfaces of the first dielectric layer 12, the etch stop layer 19, and the etch stop sidewalls 16. Corresponding to each side of the metal gate structure 17, an opening (not labeled) may be formed in the patterned mask layer 20 to expose a portion of the first dielectric layer 12. In addition, the opening may also expose a portion of the etch stop layer 19 and the corresponding etch stop sidewall 16.

In one embodiment, the patterned mask layer 20 may be made of photoresist and formed though a photolithography process. In certain other embodiments, the patterned mask layer 20 may also be a hard mask layer made of a hard material such as $SiN_x$, SiON, etc. The patterned hard mask layer may be formed by transferring a pattern of a photoresist layer to the hard mask layer. An opening may be formed in the patterned mask layer 20 on each side of the to metal gate structure 17. The position of each opening may correspond to the position of the subsequently-formed via 21 in the corresponding source/drain region.

In certain circumstances, the dimension of the opening formed in the patterned mask layer 20 may be larger than the desired dimension of the via 21 to be formed. In addition, the alignment error between the photomask plate and the substrate may also cause a considerable offset on the defined position of the opening in the patterned mask layer 20. In a subsequent process, the vias 21 may then be formed by etching the first dielectric layer 12, the etch stop sidewalls 16, and the etch stop layer 19 using such a patterned mask layer 20 with oversized and/or shifted openings as an etch mask. However, because the etch stop layer 19 and the etch stop sidewalls 16 may provide protection for the metal gate structure 17 and the first dielectric layer 12, the metal gate 17c may not be exposed by the vias 21. As a result, subsequently-formed contact plugs by filling the vias 21 with a conductive material may not be electrically connected to the metal gate 17c.

Further, using the patterned mask layer as an etch mask, a via may be formed in the first dielectric layer on each side of the metal gate structure by etching the first dielectric layer, the etch stop layer, and the etch stop sidewalls (S110).

Referring to FIG. 8, an etching process may be performed on the exposed portion of the first dielectric layer 12, the etch stop layer 19, and the etch stop sidewalls 16 using the patterned mask layer 20 as an etch mask. After the etching process, a via 21 may then be formed in the first dielectric layer 12 on each side of the metal gate structure 17. Because of the substantially low etching rate on the etch stop layer 19 and the etch stop sidewalls 16, the etch stop layer 19 and the etch stop sidewalls 16 may only be slightly etched during the formation of the vias 21 in the first dielectric layer 12.

In one embodiment, a contact-via etch stop layer 14 may be formed on the surface of the semiconductor substrate 10. During the etching process to form the vias 21, because the etching rate on the contact-via etch stop layer 14 may be significantly lower than the etching rate on the first dielectric layer 12, the contact-via etch stop layer 14 may then be used to define the termination point of the etching process. Specifically, the etching process may be stopped once the surface of the source/drain region is exposed.

Figure 9:
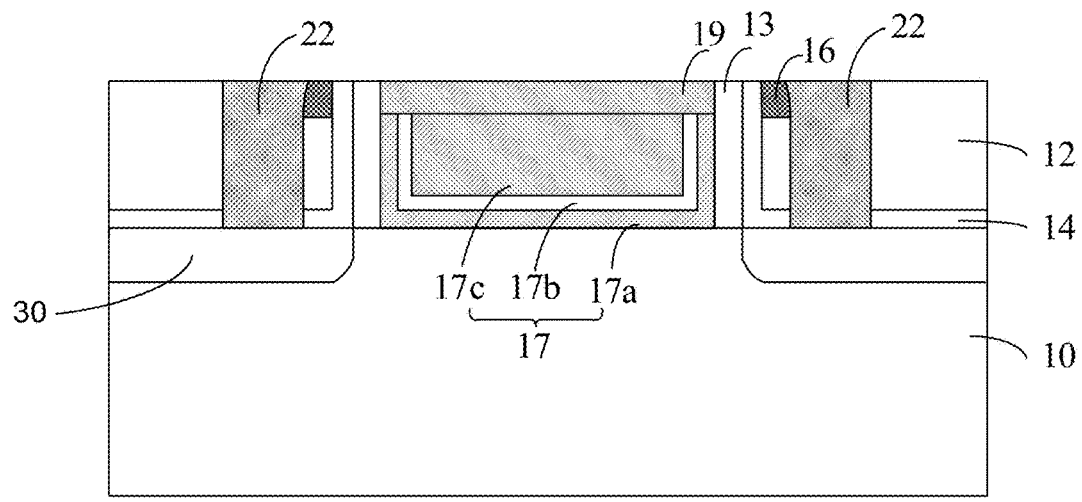

Returning to FIG. 14, after the formation of the vias in the first dielectric layer, a conductive material may be used to fill the vias to form contact plugs in the corresponding source/drain regions (S111). FIG. 9 shows a schematic cross-section view of the corresponding semiconductor structure.

Referring to FIG. 9, contact plugs 22 may be formed by filling the vias 21 in the first dielectric layer 12 with a conductive material. The conductive material used to fill the vias 21 may be one of Cu, Al, W, etc.

Because the vias 21 may not expose the metal gate 17c due to the protection of the etch stop layer 19 and the etch stop sidewalls 16, the contact plugs 22 formed by filling the vias 21 with a conductive material may not be electrically connected to the metal gate 17c. Therefore, the presence of the etch stop layer 19 and the etch stop sidewalls 16 may improve the device yield. In addition, due to the existence of the etch stop layer 19 and the etch stop sidewalls 16, the required alignment accuracy between the mask plate and the substrate may be reduced while the required precision for the photomask in the photolithography process to form the opening may also be reduced.

Figure 10:
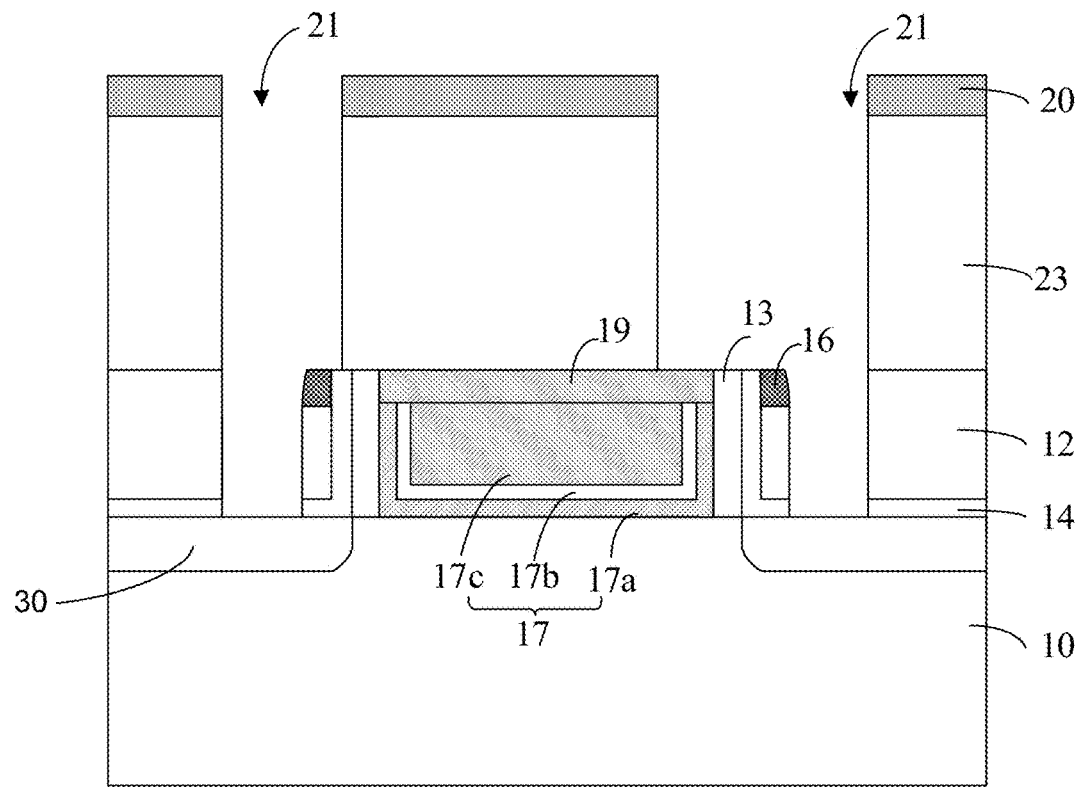
FIGS. 10-11 illustrate schematic views of semiconductor structures corresponding to certain stages of another exemplary fabrication method consistent with disclosed embodiments.
Figure 11:
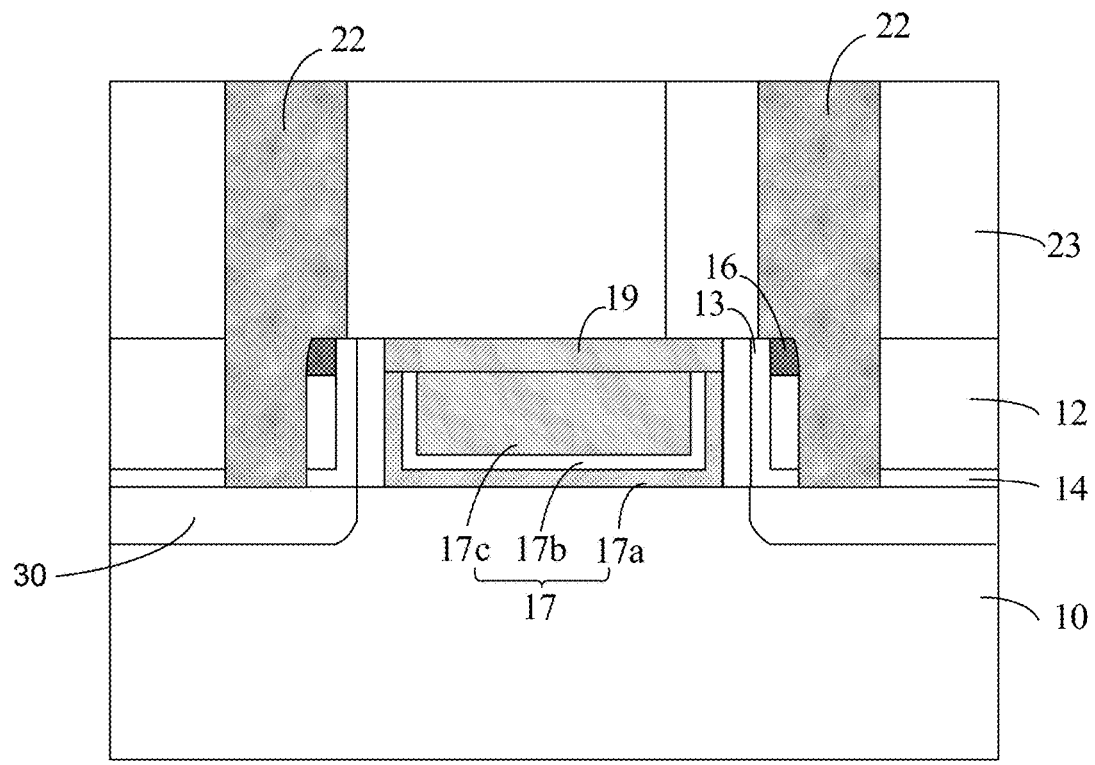

Moreover, the present disclosure also provides additional fabrication methods. For example, FIG. 10 and FIG. 11 show schematic views of semiconductor structures of source/drain regions 30 of a metal gate transistor corresponding to certain stages of another exemplary fabrication method consistent with disclosed embodiments. Specifically, FIG. 10 and FIG. 11 show schematic cross-section views of semiconductor structures fabricated based on the semiconductor structure shown in FIG. 7.

Referring to FIG. 10, after forming the etch stop layer 19 and the etch stop sidewalls 16, a second dielectric layer 23 may be formed on the top surfaces of the etch stop layer 19, the first dielectric layer 12, and the etch stop sidewalls 16. A patterned mask layer 20 may then be formed on the top surface of the second dielectric layer. Further, a via 21 may be formed on each side of the metal gate structure 17 through a dry etching process using the patterned mask layer 20 as an etch mask. Each via 21 may correspond to a source/drain region.

Specifically, as shown in FIG. 10, an opening may be formed in the patterned mask layer 20 on each side of the metal gate structure 17. The position of each opening may correspond to a via to be formed in the corresponding source/drain region. A dry etching process using the patterned mask layer 20 as an etch mask may be performed to etch through the second dielectric layer 23. In each source/drain region, the etching process may continue to etch through the first dielectric layer 12 until the contact-via etch stop layer 14 is completely removed and the surface of the corresponding source/drain region is exposed. In the meantime, a portion of the etch stop layer 19 and the etch stop sidewalls 16 may also be slightly etched.

Similar to the structure shown in FIG. 8, in certain circumstances, the dimension of the opening formed in the patterned mask layer 20 may be larger than the desired dimension of the via 21 to be formed. In addition, the alignment error between the photomask plate and the substrate may also cause a considerable offset on the defined position of the opening in the patterned mask layer 20. In a subsequent process, the vias 21 may then be formed by etching the first dielectric layer 12, the etch stop sidewalls 16, and the etch stop layer 19 using such a patterned mask layer 20 with oversized and/or shifted openings as an etch mask. However, because the etch stop layer 19 and the etch stop sidewalls 16 may provide protection for the metal gate structure 17 and the first dielectric layer 12, the metal gate 17c may not be exposed by the vias 21. As a result, subsequently-formed contact plugs 22 (referring to FIG. 11) by filling the vias 21 with a conductive material may not be electrically connected to the metal gate 17c.

In a subsequent process, a patterned mask layer (not shown) used to form a metal gate contact plug (not shown) may be formed on the second dielectric layer 23. Further, a via corresponding to the metal gate 17c may be formed by etching through the second dielectric layer 23 and the etch stop layer 19 using the patterned mask layer as an etch mask. The via formed above the metal gate 17c may then be filled with a conductive material to form a contact plug for the metal gate 17c.

Further, referring to FIGS. 1-9 and FIGS. 10-11, the transistors described in the above embodiments are planar transistors. In certain other embodiments, the method of forming an etch stop layer to cover the metal gate structure and an etch stop sidewall on each end of the etch stop layer may also be applicable to the fabrication of Fin-FETs. By incorporating the formation of the etch stop layer and the etch stop sidewalls into the fabrication process for Fin-FETs, the method may improve device yield, reduce the required accuracy in aligning the mask plate and the substrate, and reduce the required dimension precision in the photolithography process.

According to FIGS. 1-6, during the fabrication process for the planar transistor, to the dummy gate structure 11 may need to be removed before back filling the high-k dielectric layer 17a, the work function layer 17b, and the metal gate 17c to form the metal gate structure 17. Therefore, the fabrication process is a high-k last, metal gate last process. Moreover, in certain other embodiments, the method to form an etch stop layer 19 on the metal gate structure 17 with each of the two ends matching with the corresponding end of the metal gate structure 17 and form an etch stop sidewall 16 on each end of the etch stop layer 19 may also be adopted in a high-k first, metal gate last process in order to improve the device yield, reduce the required accuracy in aligning the mask plate and the substrate, and reduce the required dimension precision in the photolithography process.

Figure 12:
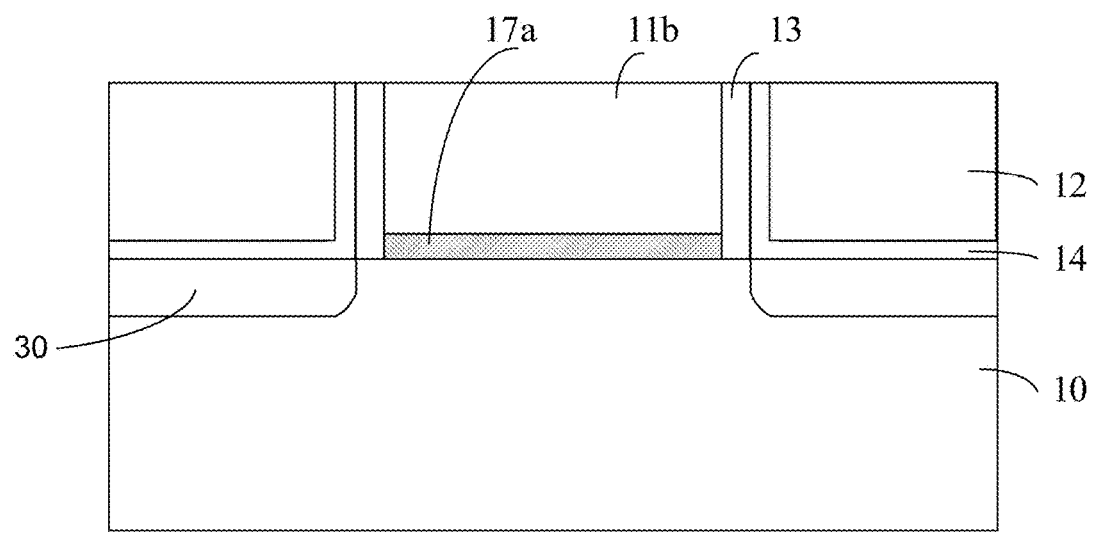
FIGS. 12-13 illustrate schematic views of semiconductor structures corresponding to certain stages of another exemplary fabrication method consistent with disclosed embodiments.
Figure 13:
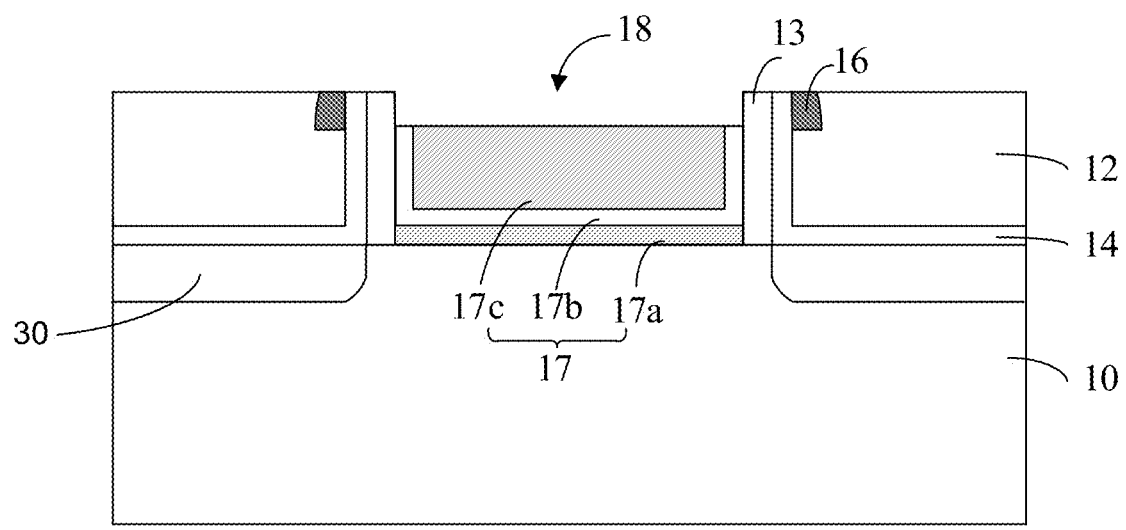

FIG. 12 and FIG. 13 show schematic cross-section views of the semiconductor structures corresponding to certain stages of an exemplary method using a high-k first, metal gate last process to fabricate a metal gate transistor consistent with disclosed embodiments. In the following, the differences between the embodiments corresponding to FIGS. 1-11 and the embodiments corresponding to FIG. 12 and FIG. 13 are illustrated.

First, referring to FIG. 12, a semiconductor substrate 10 is provided. Different from the semiconductor substrate 10 shown in FIG. 1, a high-k dielectric layer 17a may be formed on the surface of the semiconductor substrate 10 and a dummy gate electrode 11b may then be formed on the high-k dielectric layer 17a. Further, a first dielectric layer 12 may be formed to surround the high-k dielectric layer 17a and the dummy gate electrode 11b with the top surface of the first dielectric layer 12 leveled with the top surface of the dummy gate electrode 11b.

In certain other embodiments, a high-k dielectric layer 17a, a dummy gate electrode 11b, and a dummy gate hard mask layer (not shown) may be sequentially formed on the top surface of the semiconductor substrate 10. That is, an additional dummy gate hard mask layer may be formed on the dummy gate electrode 11b. Accordingly, a first dielectric layer 12 may be formed to surround the high-k dielectric layer 17a, the dummy gate electrode 11b, and the dummy gate hard mask layer.

Second, referring to FIG. 13, in one embodiment, different from the structure shown in FIG. 6, the high-k dielectric layer 17a may not be removed after forming the etch stop sidewalls 16. That is, only the dummy gate electrode 11b may be removed. Further, a first trench may be formed by removing the dummy gate electrode 11b. Then, a work function layer 17b and a metal gate 17c may be sequentially filled in to the first trench.

Further, a top portion of the material filled in the first trench may be removed to form a second trench above the metal gate structure 17 and an etch stop layer 19 may then be formed by back filling the second trench. The material removed from the top of the first trench is a portion of the work function layer 17b and the metal gate 17c. The portion of the work function layer 17b and the metal gate 17c may be removed by a dry etching process or a wet etching process. When a dry etching process is performed, the etching gas may be $SF_6$ or $Cl_2$. When a wet etching process is performed, the etching solution may be a mixture of $NH_4OH$, $H_2O_2$, and water (for example, a volume ratio of 1:1:5 for a 25% wt. $NH_4OH$ solution, $H_2O_2$, and $H_2O$), or a mixture of HCl, $H_2O_2$, and water (for example, a volume ratio of 1:1:6 for pure HCl acid, $H_2O_2$, and $H_2O$).

For the high-k first, metal gate last process, similar to the structures shown in FIG. 7 and FIG. 8, a patterned mask layer 20 may be formed on the top surfaces of the etch stop layer 19, the first dielectric layer 12, and the etch stop sidewalls 16. An opening may be formed in the patterned mask layer 20 on each side of the metal gate structure 17 with the position of the opening corresponding to the position of a contact via 21 in the corresponding source/drain region. A via 21 may then be formed in the first dielectric layer on each side of the metal gate structure 17 through a dry etching process using the patterned mask layer 20 as an etch mask.

Alternatively, in order to form the vias 21 on both sides of the metal gate structure 17, referring to FIG. 10, a second dielectric layer 23 may be first formed on the top surfaces of the etch stop layer 19, the first dielectric layer 12, and the etch stop sidewalls 16. A patterned mask layer 20 may then be formed on the second dielectric layer 23. An opening may be formed in the patterned mask layer 20 on each side of the metal gate structure 17 with the position of the opening corresponding to the position of a contact via 21 in the corresponding source/drain region. A via 21 may then be formed in the first dielectric layer on each side of the metal gate structure 17 through a dry etching process using the patterned mask layer 20 as an etch mask to etch the second dielectric layer 23, the etch stop layer 19, the etch stop sidewalls 16, and the first dielectric layer 12.

Moreover, in addition to being used in fabricating planar transistors, the high-k first, metal gate last process may also be applicable to the fabrication of fin-FET transistors.

The present disclosure also provides a metal gate transistor. Referring to FIG. 9, the metal gate transistor includes a semiconductor substrate 10, a metal gate structure 17 formed on the semiconductor substrate 10, and a first dielectric layer 12 surrounding the metal gate structure 17. The metal gate structure further includes a high-k dielectric layer 17a formed on the surface of the semiconductor substrate 10, a work function layer 17b formed on the surface of the high-k dielectric layer 17a, and a metal gate 17c formed on the surface of the work function layer 17b. The metal gate structure 17 is covered by an etch stop layer 19. An etch stop sidewall 16 is formed on each end of the etch stop layer 19. The disclosed metal gate transistor also includes a source/drain region in the semiconductor substrate on each side of the metal gate structure 17. Corresponding to each source/drain region, a contact plug 22 is formed in the first dielectric layer 12. The contact plug 22 is electrically isolated from the metal gate structure 17 due to the presence of the etch stop layer 19 and the etch stop sidewalls 16. The first dielectric layer 12, the contact plugs 22, the etch stop sidewalls 16, and the etch stop layer 19 may all have a coplanar top surface.

According to the disclosed metal gate transistor and the fabrication methods, despite potentially oversized and/or shifted openings formed in the patterned mask layer 20, the vias 21 formed through a dry etching process using the patterned mask layer 20 as an etch mask may not expose the metal gate 17c because of the protection provided by the etch stop layer 19 and the etch stop sidewalls 16. Therefore, the contact plugs 22 formed subsequently by filling up the vias 21 with a conductive material may not be electrically connected to the metal gate 17c. As such, the device yield may be improved, the required alignment accuracy between the mask plate and the substrate may be reduced, and the required dimension precision in the photolithography process may also be reduced.

Compared to traditional metal gate transistor and fabrication methods, the disclosed metal gate transistor and fabrication method may demonstrate several advantages.

First, according to the disclosed fabrication methods, an etch stop layer may be formed to cover the metal gate structure with each end of the etch stop layer matching with the corresponding end of the metal gate structure; in addition, an etch stop sidewall may also be formed on each end of the etch stop layer. Specifically, for a high-k last, metal gate last process, the etch stop layer may be formed after the dummy gate structure is removed and the high-k dielectric layer, the work function layer, and the metal gate are filled in; while for a high-k first, metal gate last process, the etch stop layer may be formed after the dummy gate electrode is removed and the work function layer and the metal gate are filled in.

The etch stop layer and the etch stop sidewalls may be made of an insulating material different from the material used to form the dielectric layer which surrounds the metal gate structure. During a subsequent dry etching process to form contact vias in the dielectric layer for the source/drain regions, the etch stop layer and the etch stop sidewalls may provide protection for the metal gate structure and the dielectric layer. Therefore, the vias formed by the dry etching process may not expose the metal gate despite a potential alignment offset between the mask plate and the substrate and/or oversized openings formed in the mask plate corresponding to the vias. As a consequence, after filling a conductive material into the vias, the conductive material may not be electrically connected to the metal gate. As such, the device yield may be improved, the required alignment accuracy between the mask plate and the substrate may be reduced, and the required dimension precision in the photolithography process may also be reduced.

According to the disclosed method, after forming the etch stop layer and the etch stop sidewalls, the top surface of the etch stop layer and the top surface of the etch stop sidewalls may be leveled with the top surface of the dielectric layer that covers the metal gate. Further, after forming the etch stop layer and the etch stop sidewalls to protect the metal gate structure and the dielectric layer, several fabrication methods are provided to form electrical connections for the source/drain regions and the metal gate and to complete the metal gate transistor.

For example, one method to complete the metal gate transistor may include forming a patterned mask layer on the top surfaces of the etch stop sidewalls, the etch stop layer, and the dielectric layer. The openings formed in the patterned mask layer may correspond to the contact vias to be formed in the source/drain regions. The method may further include forming the vias by etching the etch stop layer, the etch stop sidewalls, and the dielectric layer using the mask layer as an etch mask and then forming contact plugs for the source/drain regions by filling up the vias with a conductive material. Further, the method may also include forming an upper-level dielectric layer (i.e., a second dielectric layer) over the contact plugs, the dielectric layer, the etch stop layer, and the etch stop sidewalls, and then forming upper-level vias by etching the upper-level dielectric layer using an etch mask. The upper-level vias formed in the upper-level dielectric layer may be aligned with the contact plugs in the source/drain regions or may expose the metal gate. Finally, the method may include forming conductive plugs electrically connected to the metal gate or the source/drain regions by filling up the upper-level vias with a conductive material.

Alternatively, another method to complete the metal gate transistor may include forming an upper-level dielectric layer on the top surfaces of the etch stop sidewalls, the etch stop layer, and the dielectric layer, and then forming a patterned mask layer on the upper-level dielectric layer. The openings formed in the patterned mask layer may correspond to the contact vias to be formed in the source/drain regions. The method may then include forming the contact vias for the source/drain regions by etching the upper-level dielectric layer, the etch stop layer, the etch stop sidewalls, and the dielectric layer using the patterned mask layer as an etch mask, and then forming contact plugs in the source/drain regions by filling up the contact vias with a conductive material. The method may further include forming another patterned mask layer on the upper-level dielectric layer in order to form a contact plug for the metal gate. That is, the opening formed in the patterned mask layer may correspond to the metal gate. Finally, the method may include forming a via by etching the upper-level dielectric layer using the patterned mask layer as an etch mask, and then forming the contact plug for the metal gate by filling up the via with a conductive material.

Moreover, the disclosed metal gate transistor may be a planar transistor or a Fin-FET. Therefore, the disclosed metal gate transistor and the fabrication method may have a broad scope of application.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a metal gate transistor, comprising:

forming a dummy gate structure and a first dielectric layer on a semiconductor substrate and a source/drain region in the semiconductor substrate on each side of the dummy gate structure, wherein the dummy gate structure is surrounded by the first dielectric layer and a top surface of the dummy gate structure is leveled with a top surface of the first dielectric layer;

forming an etch stop sidewall in the first dielectric layer on each side of the dummy gate structure, wherein the etch stop sidewall, the first dielectric layer, and the dummy gate structure have a coplanar top surface;

forming an offset spacer on each side of the dummy gate structure between the etch stop sidewall and the dummy gate structure;

forming a contact-via etch stop layer on the semiconductor substrate and the sidewall of the offset spacer;

forming a first trench by removing the dummy gate structure;

forming a metal gate structure to partially fill the first trench, wherein a top portion of the first trench becomes a second trench;

forming an etch stop layer to fill the second trench, wherein a top surface of the etch stop layer is leveled with top surfaces of the first dielectric layer and the etch stop sidewalls; and forming a contact plug in the first dielectric layer to electrically connect to each source/drain region.

2. The method for fabricating the metal gate transistor according to claim 1, wherein forming the metal gate structure to partially fill the first trench further includes:

sequentially filling a high-k dielectric layer, a work function layer, and a metal gate into the first trench; and removing a top portion of the high-k dielectric layer, the work function layer, and the metal gate.

3. The method for fabricating the metal gate transistor according to claim 1, wherein forming the contact plug to electrically connect to each source/drain region further includes:

forming a patterned mask layer on the top surfaces of the first dielectric layer, the etch stop layer, and the etch stop sidewalls, wherein an opening is formed in the patterned mask layer corresponding to each source/drain region;

forming a via in the semiconductor substrate corresponding to each source/drain region by etching the first dielectric layer, the etch stop layer, and the etch stop sidewalls using the patterned mask layer as an etch mask; and forming the contact plug to electrically connect to each source/drain region by filling the corresponding via with a conductive material.

4. The method for fabricating the metal gate transistor according to claim 3, wherein after forming the etch stop layer, a second dielectric layer is formed on the top surfaces of the etch stop layer, the first dielectric layer, and the etch stop sidewalls, and coordinately, the patterned mask layer is formed on the top surface of the second dielectric layer; and the vias are formed in the first dielectric layer and the second dielectric layer by etching the second dielectric layer, the first dielectric layer, the etch stop layer, and the etch stop sidewalls using the patterned mask layer as an etch mask.

5. The method for fabricating the metal gate transistor according to claim 1, wherein the first dielectric layer is separated from the dummy gate structure and the semiconductor substrate by contact-via etch stop layers.

6. The method for fabricating the metal gate transistor according to claim 1, wherein the dummy gate structure includes a dummy gate insulating layer formed on the semiconductor substrate and a dummy gate electrode formed on the top of the dummy gate insulating layer.

7. The method for fabricating the metal gate transistor according to claim 6, wherein the dummy gate structure further includes a dummy gate structure hard mask layer formed on the dummy gate electrode.

8. The method for fabricating the metal gate transistor according to claim 1, wherein:

the etch stop sidewalls are made of at least one of $SiN_x$, SiON, SiOBN, SiOCN; and the etch stop sidewalls are formed by an atomic layer deposition or a chemical vapor deposition method.

9. The method for fabricating the metal gate transistor according to claim 1, wherein:

the etch stop layer is made of at least one of $SiN_x$, SiON, SiOBN, SiOCN; and the etch stop layer is formed by an atomic layer deposition or a chemical vapor deposition method.

10. The method for fabricating the metal gate transistor according to claim 2, wherein:

the high-k dielectric layer is made of at least one of $La_2O_3$, $BaZrO_3$, HfZrO, HfZrON, HfLaO, HfSiO, HfSiON, LaSiO, AlSiO, HfTaO, HfSiO, BaO, TiO, $Ti_2O_3$, $TiO_2$, SrO, $Al_2O_3$, $Si_3N_4$;

the work function layer is made of at least one of Ti, Al, $Ti_xAl_{1-x}$, TiC, TiAlC;

the metal gate is made of W;

when a dry etching process is performed to remove the top portion of the high-k dielectric layer, the work function layer, and the metal gate, an etching gas containing at least one of $CF_4$, $CHF_3$, and $C_3F_8$, together with $SF_6$, or contains at least one of $CF_4$, $CHF_3$, and $C_3F_8$, together with $Cl_2$ is used; and when a wet etching process is performed to remove the top portion of the high-k dielectric layer, a HF acid solution is used as an etching solution while when a wet etching process is performed to remove the top portion of the work function layer and the metal gate, a mixture of $NH_4OH$, $H_2O_2$, and water, or a mixture of HCl, $H_2O_2$, and water is used as a wet etching solution.

11. The method for fabricating the metal gate transistor according to claim to claim 1, wherein the metal gate transistor is a planar FET or a fin-FET.

12. A method for fabricating a metal gate transistor, comprising:

forming a dummy gate structure and a first dielectric layer on a semiconductor substrate and a source/drain region in the semiconductor substrate on each side of the dummy gate structure, wherein the dummy gate structure is surrounded by the first dielectric layer and a top surface of the dummy gate structure is leveled with a top surface of the first dielectric layer;

forming an etch stop sidewall in the first dielectric layer on each side of the dummy gate structure, wherein the etch stop sidewall, the first dielectric layer, and the dummy gate structure have a coplanar top surface, wherein forming the etch stop sidewall in the first dielectric layer on each side of the dummy gate structure further includes:

removing a top portion of the first dielectric layer to expose a portion of the dummy gate structure;

forming a sidewall on each side surface of the exposed portion of the dummy gate structure;

depositing a material of the first dielectric layer to cover the dummy gate structure, the sidewalls, and a remaining portion of the first dielectric layer; and forming the etch stop sidewall on each side of the dummy gate structure by removing a top portion of the corresponding sidewall;

forming a first trench by removing the dummy gate structure;

forming a metal gate structure to partially fill the first trench, wherein a top portion of the first trench becomes a second trench;

forming an etch stop layer to fill the second trench, wherein a top surface of the etch stop layer is leveled with top surfaces of the first dielectric layer and the etch stop sidewalls; and forming a contact plug in the first dielectric layer to electrically connect to each source/drain region.

13. The method for fabricating the metal gate transistor according to claim 12, wherein forming the metal gate structure to partially fill the first trench further includes:

sequentially filling a high-k dielectric layer, a work function layer, and a metal gate into the first trench; and removing a top portion of the high-k dielectric layer, the work function layer, and the metal gate.

14. The method for fabricating the metal gate transistor according to claim 12, wherein the first dielectric layer is separated from the dummy gate structure and the semiconductor substrate by contact-via etch stop layers.

15. The method for fabricating the metal gate transistor according to claim 12, wherein the dummy gate structure includes a dummy gate insulating layer formed on the semiconductor substrate and a dummy gate electrode formed on the top of the dummy gate insulating layer.

16. A method for fabricating a metal gate transistor, comprising:

forming a high-k dielectric layer on a semiconductor substrate and a dummy gate electrode on the high-k dielectric layer;

forming a source/drain region in the semiconductor substrate on each side of the high-k dielectric layer and a first dielectric layer on the semiconductor substrate to surround the high-k dielectric layer and the dummy gate electrode, wherein a top surface of the dummy gate electrode is leveled with a top surface of the first dielectric layer;

forming an etch stop sidewall in the first dielectric layer on each side of the dummy gate electrode, wherein the etch stop sidewall, the first dielectric layer, and the dummy gate electrode have a coplanar top surface;

forming an offset spacer on each side of the dummy gate structure between the etch stop sidewall and the dummy gate structure;

forming a contact-via etch stop layer on the semiconductor substrate and the sidewall of the offset spacer;

forming a first trench by removing the dummy gate electrode;

forming a metal gate structure to partially fill the first trench, wherein the high-k dielectric layer is a dielectric layer of the metal gate structure and a top portion of the first trench becomes a second trench;

forming an etch stop layer to fill the second trench, wherein a top surface of the etch stop layer is leveled with top surfaces of the first dielectric layer and the etch stop sidewalls; and forming a contact plug in the first dielectric layer to electrically connect to each source/drain region.

17. The method for fabricating the metal gate transistor according to claim 16, wherein forming the etch stop sidewall in the first dielectric layer on each side of the dummy gate electrode further includes:

removing a top portion of the first dielectric layer to expose a portion of the dummy gate electrode;

forming a sidewall on each side surface of the exposed portion of the dummy gate electrode;

depositing a material of the first dielectric layer to cover the dummy gate electrode, the sidewalls, and a remaining portion of the first dielectric layer; and forming the etch stop sidewall on each side of the dummy gate electrode by removing a top portion of the corresponding sidewall.

18. The method for fabricating the metal gate transistor according to claim 16, wherein forming the metal gate structure to partially fill the first trench further includes:

sequentially filling a work function layer and a metal gate into the first trench; and removing a top portion of the work function layer and the metal gate.

19. The method for fabricating the metal gate transistor according to claim 16, wherein forming the contact plug to electrically connect to each source/drain region further includes:

forming a patterned mask layer on the top surfaces of the first dielectric layer, the etch stop layer, and the etch stop sidewalls, wherein an opening is formed in the patterned mask layer corresponding to each source/drain region;

forming a via in the semiconductor substrate corresponding to each source/drain region by etching the first dielectric layer, the etch stop layer, and the etch stop sidewalls using the patterned mask layer as an etch mask; and forming the contact plug to electrically connect to each source/drain region by filling the corresponding via with a conductive material.

20. The method for fabricating the metal gate transistor according to claim 19, wherein after forming the etch stop layer, a second dielectric layer is formed on the top surfaces of the etch stop layer, the first dielectric layer, and the etch stop sidewalls, and coordinately, the patterned mask layer is formed on the top surface of the second dielectric layer; and the vias are formed in the first dielectric layer and the second dielectric layer by etching the second dielectric layer, the first dielectric layer, the etch stop layer, and the etch stop sidewalls using the patterned mask layer as an etch mask.

\* \* \* \* \*